US012805257B2

(12) United States Patent
Sato et al.

(10) Patent No.: US 12,805,257 B2
(45) Date of Patent: Nov. 17, 2026

(54) SUBSTRATE FIXING DEVICE

(71) Applicant: SHINKO ELECTRIC INDUSTRIES CO., LTD., Nagano (JP)

(72) Inventors: Keita Sato, Nagano (JP); Riku Nishikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 144 days.

(21) Appl. No.: 18/886,132

(22) Filed: Sep. 16, 2024

(65) Prior Publication Data

US 2025/0096026 A1 Mar. 20, 2025

(30) Foreign Application Priority Data

Sep. 20, 2023 (JP) ................................ 2023-152630

(51) Int. Cl.
*H10P 72/72* (2026.01)

(52) U.S. Cl.
CPC ................................ *H10P 72/722* (2026.01)

(58) Field of Classification Search
CPC ................................................. H10P 72/722
See application file for complete search history.

(56) References Cited

U.S. PATENT DOCUMENTS

| | | | | |
|---|---|---|---|---|
| 2009/0059461 | A1* | 3/2009 | Yonekura | H10P 72/722 361/234 |
| 2018/0047604 | A1* | 2/2018 | Takemoto | H10P 72/72 |
| 2021/0391203 | A1* | 12/2021 | Harayama | H10P 72/722 |
| 2025/0069941 | A1* | 2/2025 | Park | H10P 72/722 |

FOREIGN PATENT DOCUMENTS

| | | |
|---|---|---|
| JP | 2020-023088 A | 2/2020 |

* cited by examiner

*Primary Examiner* — Thienvu V Tran
*Assistant Examiner* — Christopher J Clark
(74) *Attorney, Agent, or Firm* — Rankin, Hill & Clark LLP

(57) ABSTRACT

A substrate fixing device includes a ceramic base plate, a ceramic electrostatic chuck having a mounting surface on which a target object to be adsorbed is mounted, and an adhesion layer bonding the base plate and the electrostatic chuck.

12 Claims, 6 Drawing Sheets

SUBSTRATE FIXING DEVICE

CROSS-REFERENCE TO RELATED APPLICATIONS

This application claims priority from Japanese Patent Application No. 2023-152630 filed on Sep. 20, 2023, the contents of which are incorporated herein by reference.

TECHNICAL FIELD

The present invention relates to a substrate fixing device.

BACKGROUND ART

In the related art, a film formation apparatus (for example, a CVD apparatus, a PVD apparatus, and the like) and a plasma etching apparatus that are used when manufacturing a semiconductor device as an IC and an LSI have a substrate fixing device for accurately holding a substrate such as a silicon wafer in a vacuum treatment chamber. In the substrate fixing device, a ceramic electrostatic chuck is bonded to a metal base plate by an adhesion layer (for example, see Patent Literature 1).

CITATION LIST

Patent Literature

Patent Literature 1: JP2020-23088A

SUMMARY OF INVENTION

However, in the substrate fixing device of the related art, unevenness may occur in temperature of a mounting surface of the electrostatic chuck on which a target object to be adsorbed is mounted. Specifically, when the substrate fixing device is exposed to a low temperature of about −60° C. or a high temperature of about 180° C., a large difference occurs between an amount of thermal deformation of the electrostatic chuck and an amount of thermal deformation of the base plate. Then, since a large stress acts on the adhesion layer, cohesive failure may occur in the adhesion layer. When the cohesive failure occurs in the adhesion layer, the in-plane uniformity of a thermal resistance of the adhesion layer decreases, causing unevenness in the temperature of the mounting surface of the electrostatic chuck.

According to one aspect of the present invention, a substrate fixing device comprises:

- a ceramic base plate;
- a ceramic electrostatic chuck having a mounting surface on which a target object to be adsorbed is mounted; and
- an adhesion layer bonding the base plate and the electrostatic chuck.

According to one aspect of the present invention, it is possible to obtain an effect capable of improving uniformity of the temperature of the mounting surface.

DESCRIPTION OF EMBODIMENTS

Hereinafter, one embodiment will be described with reference to the accompanying drawings.

Note that, for convenience, in the accompanying drawings, a characteristic part is enlarged so as to easily understand the feature, and the dimension ratios of the respective constitutional elements may be different in the respective drawings. Further, in the cross-sectional views, hatching of some members is shown in a satin form and hatching of some members is omitted, so as to easily understand a sectional structure of each member. Note that in the present specification, the 'upper-lower direction' and the 'left-right direction' are directions when a direction in which the reference sign indicating each member can be accurately read in each drawing is set as a normal position.

(Overall Configuration of Substrate Fixing Device 10)

Figure 1:
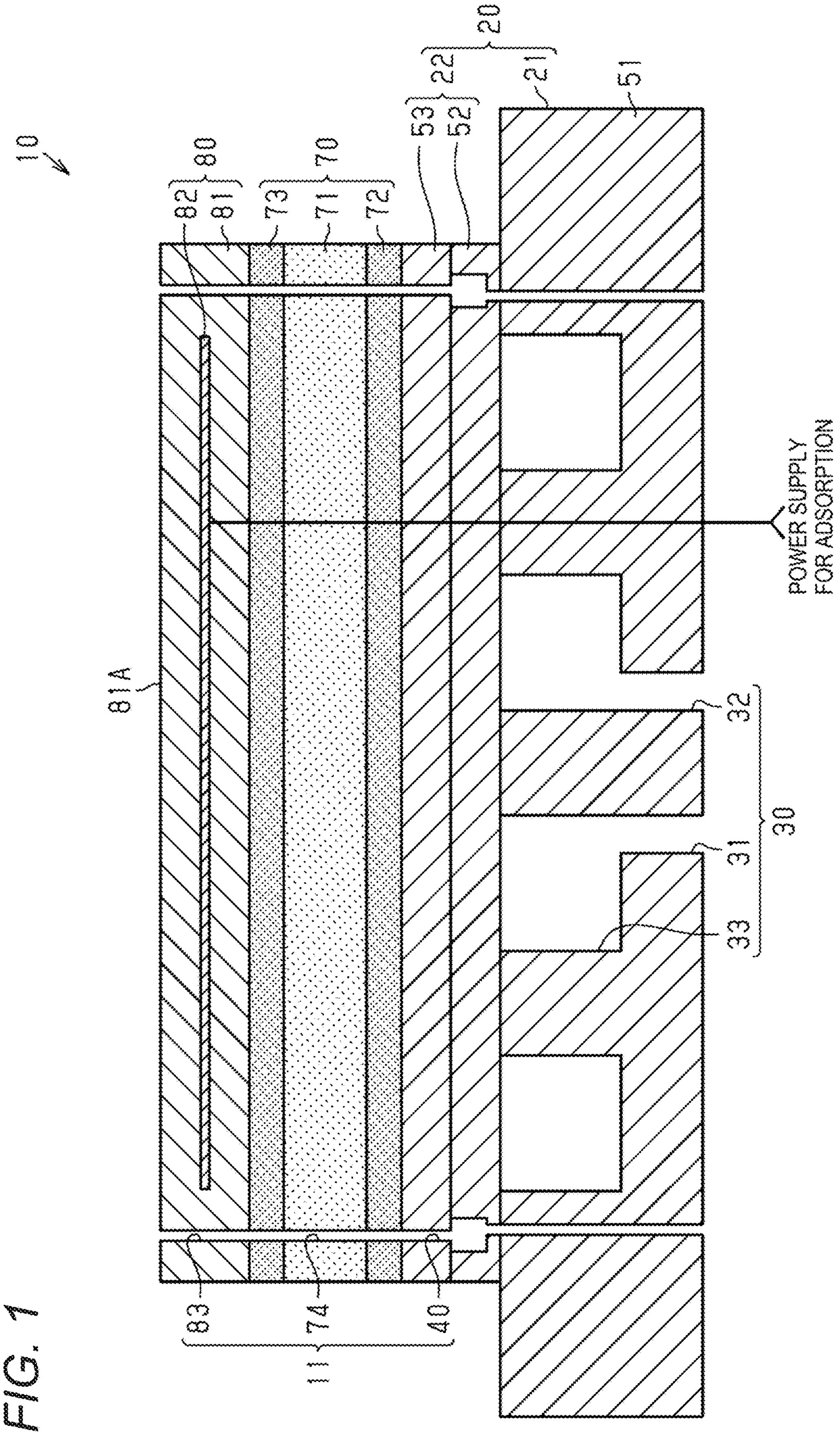
FIG. 1 is a schematic cross-sectional view showing a substrate fixing device according to an embodiment.

As shown in FIG. 1, a substrate fixing device 10 includes a ceramic base plate 20, an adhesion layer 70, and a ceramic electrostatic chuck 80. The electrostatic chuck 80 is fixed on an upper surface of the base plate 20 by the adhesion layer 70. The substrate fixing device 10 is a device that adsorbs and holds a substrate (not shown), which is a target object to be adsorbed, by the electrostatic chuck 80 mounted on the upper surface of the base plate 20. Examples of the substrate include a silicon wafer. Note that a diameter of the substrate may be, for example, about 8 inches, 12 inches, or 18 inches.

As materials for the base plate 20 and the electrostatic chuck 80, ceramic materials such as aluminum oxide, aluminum nitride, and silicon nitride may be used. The material of the base plate 20 and the material of the electrostatic chuck 80 may be the same ceramic material or may be different ceramic materials. For example, the material of the base plate 20 and the material of the electrostatic chuck 80 may be ceramic materials containing the same material as a main component and having different purities. Here, the "main component" in the present specification is a component that accounts for 90 wt % or more of components contained in a target portion. The material of the base plate 20 of the present embodiment is a ceramic material containing aluminum oxide as a main component. The material of the electrostatic chuck 80 of the present embodiment is a ceramic material containing aluminum oxide as a main component and having a purity of aluminum oxide higher than that of the base plate 20. Here, the base plate 20 preferably has a purity of aluminum oxide of 90% or higher, and more preferably 94% or higher. The electrostatic chuck 80 preferably has a purity of aluminum oxide of 95% or higher, and more preferably 99.5% or higher. The electrostatic chuck 80 is configured using high-purity aluminum oxide in this way, so that the temperature dependence of the insulation resistance of the electrostatic chuck 80 can be reduced and a decrease in the insulation resistance due to temperature rise can be suppressed. Note that the purity of 99.5% or higher indicates that a sintering aid is not added. In addition, the purity of 99.5% or higher means that unintended impurities may be included during a manufacturing process and the like.

(Configuration of Base Plate 20)

The base plate 20 is a base body for mounting the electrostatic chuck 80. The base plate 20 has stiffness for supporting the electrostatic chuck 80. A thickness of the base plate 20 may be, for example, about 20 mm to 50 mm.

The base plate 20 has a lower part 21 and an upper part 22 stacked on an upper surface of the lower part 21. The lower part 21 has a disc shape, for example. The upper part 22 has a disc shape, for example. The upper part 22 is arranged concentrically on the upper surface of the lower part 21, for example. The upper part 22 is smaller in size than the lower part 21 in a plan view. A diameter of the upper part 22 is smaller than a diameter of the lower part 21. The upper part 22 is formed to protrude upward from the upper surface of the lower part 21.

In the base plate 20, for example, a cooling channel 30 is provided. The cooling channel 30 has an introduction portion 31 provided at one end and a discharge portion 32 provided at the other end. The cooling channel 30 is connected to a cooling medium control device (not shown) provided outside the substrate fixing device 10, for example. The cooling medium control device introduces a cooling medium into the cooling channel 30 from the introduction portion 31 and discharges the cooling medium from the discharge portion 32. By circulating the cooling medium in the cooling channel 30 to cool the base plate 20, it is possible to cool the substrate adsorbed on the electrostatic chuck 80. Note that as the cooling medium, for example, water or Galden may be used.

In the base plate 20, for example, a gas flow channel 40 is provided. The gas flow channel 20 is formed to penetrate the base plate 20 in a thickness direction (upper-lower direction in the drawing). Specifically, the gas flow channel 40 penetrates from an upper surface of the upper part 22 to a lower surface of the lower part 21. The gas flow channel 40 is introduced with, for example, a gas for cooling the substrate adsorbed on the electrostatic chuck 80. As the gas for cooling, an inert gas may be used. As the inert gas, for example, a helium (He) gas, an argon (Ar) gas, or the like may be used.

The base plate 20 has, for example, a structure in which a plurality of layers (here, three layers) of ceramic plates 51, 52, and 53 are stacked. Each of the ceramic plates 51, 52, and 53 is, for example, a sintered body formed by sintering a green sheet made of a mixture of aluminum oxide and an organic material. The ceramic plate 52 is joined to an upper surface of the ceramic plate 51, and the ceramic plate 53 is joined to an upper surface of the ceramic plate 52. The joining of the ceramic plate 51 and the ceramic plate 52 and the joining of the ceramic plate 52 and the ceramic plate 53 can be performed by, for example, soldering.

The ceramic plate 51 constitutes the lower part 21 of the base plate 20, for example. The ceramic plate 51 has a disc shape, for example. The ceramic plate 51 has, for example, the introduction portion 31, the discharge portion 32, and a recessed portion 33 that constitute the cooling channel 30.

The recessed portion 33 is formed to be recessed downward from the upper surface of the ceramic plate 51. The recessed portion 33 is formed to open upward of the ceramic plate 51. The introduction portion 31 is formed to be recessed upward from the lower surface of the ceramic plate 51 and to communicate with the recessed portion 33. The introduction portion 31 is formed to open downward of the ceramic plate 51. The discharge portion 32 is formed to be recessed upward from the lower surface of the ceramic plate 51 and to communicate with the recessed portion 33. The discharge portion 32 is formed to open downward of the ceramic plate 51.

Figure 2:
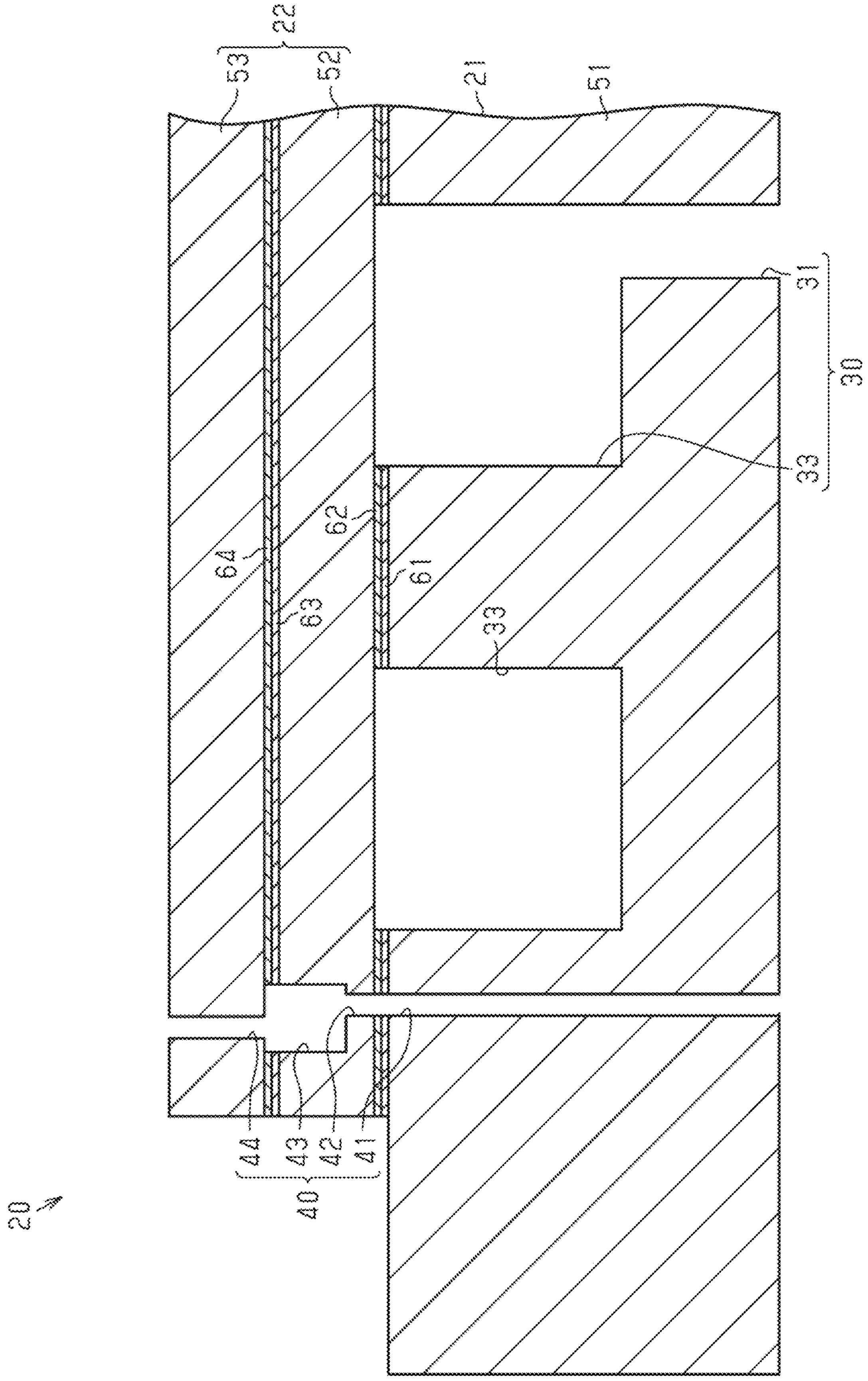
FIG. 2 is an enlarged cross-sectional view showing a part of a base plate shown in FIG. 1.

As shown in FIG. 2, the ceramic plate 51 has a hole portion 41 constituting the gas flow channel 40. The hole portion 41 is formed to penetrate the ceramic layer 51 in the thickness direction. The hole portion 41 is formed to open upward of the ceramic plate 51 and to open downward of the ceramic plate 51. The hole portion 41 is formed to linearly extend along the thickness direction of the ceramic plate 51, for example.

A conductive pattern 61 is provided on the upper surface of the ceramic plate 51. The conductive pattern 61 is provided to overlap the ceramic plate 52 in a plan view, for example. The conductive pattern 61 is provided so as not to overlap the recessed portion 33 and the hole portion 41 in a plan view, for example.

The ceramic plates 52 and 53 constitute the upper part 22 of the base plate 20, for example. The ceramic plates 52 and 53 are formed, for example, in a disc shape. The ceramic plates 52 and 53 are smaller in size than the ceramic plate 51 in a plan view. The ceramic plate 52 has the same size as the ceramic plate 53 in a plan view.

The ceramic plate 52 is provided to close an opening of the recessed portion 33 of the ceramic plate 51. In this way, the cooling path 30 is formed by the ceramic plate 52 closing the opening of the recessed portion 33, the recessed portion 33, the introduction portion 31, and the discharge portion 32 (see FIG. 1).

The ceramic plate 52 has hole portions 42 and 43 constituting the gas flow channel 40. The hole portion 42 and the hole portion 43 are formed to communicate with each other. The hole portion 42 and the hole portion 43 are formed to penetrate the ceramic plate 52 in the thickness direction in cooperation. The hole portion 42 is formed to be recessed upward from the lower surface of the ceramic plate 52. The hole portion 42 is formed to open downward of the ceramic plate 52. The hole portion 42 is formed to communicate with the hole portion 41 of the ceramic plate 51. The hole portion 42 is formed to linearly extend along the thickness direction of the ceramic plate 52, for example.

The hole portion 43 is formed to be recessed downward from the upper surface of the ceramic plate 52 and to communicate with the hole portion 42. The hole portion 43 is formed to open upward of the ceramic plate 52. The hole portion 43 is larger in size than the hole portion 42 in a plan view. That is, an opening area of the hole portion 43 is larger than an opening area of the hole portion 42. The hole portion 43 is provided to overlap the entire hole portion 42 in a plan view. Additionally, the ceramic plate 52 may be provided with a groove portion formed to be recessed downward from the upper surface of the ceramic plate 52.

A conductive pattern 62 is provided on the lower surface of the ceramic plate 52. The conductive pattern 62 is provided to overlap the conductive pattern 61 in a plan view, for example. The conductive pattern 62 is provided so as not to overlap the recessed portion 33 and the hole portions 41 and 42 in a plan view, for example. The conductive pattern 61 and the conductive pattern 62 are joined to each other by soldering using a soldering material (not shown) such as silver solder, for example. The conductive pattern 61 and the conductive pattern 62 are joined to each other, so that the ceramic plate 51 and the ceramic plate 52 are joined to each other. Thereby, the ceramic plate 52 is stacked on the upper surface of the ceramic plate 51.

A conductive pattern 63 is provided on the upper surface of the ceramic plate 52. The conductive pattern 63 is provided so as not to overlap the hole portion 43 in a plan view, for example. For example, the conductive pattern 63 is formed to cover the entire upper surface of the ceramic plate 52.

The ceramic plate 53 has a hole portion 44 constituting the gas flow channel 40. The hole portion 44 is formed to penetrate the ceramic layer 53 in the thickness direction. The hole portion 44 is formed to open upward of the ceramic plate 53 and to open downward of the ceramic plate 53. The hole portion 44 is formed to communicate with the hole portion 43 of the ceramic plate 52. The hole portion 44 is formed to linearly extend along the thickness direction of the ceramic plate 53, for example. The hole portion 44 is smaller in size than the hole portion 43 in a plan view, for example. That is, an opening area of the hole portion 44 is smaller than an opening area of the hole portion 43. The hole portion 44 is provided to entirely overlap the hole portion 43 in a plan view. For example, the hole portion 44 is provided at a different position from the hole portion 42 in a plan view.

A conductive pattern 64 is provided on the lower surface of the ceramic plate 53. The conductive pattern 64 is provided to overlap the conductive pattern 63 in a plan view, for example. The conductive pattern 64 is provided so as not to overlap the hole portions 43 and 44 in a plan view, for example. The conductive pattern 63 and the conductive pattern 64 are joined to each other by soldering using a soldering material (not shown) such as silver solder, for example. The conductive pattern 63 and the conductive pattern 64 are joined to each other, so that the ceramic plates 52 and 53 are joined to each other. Thereby, the ceramic plate 53 is stacked on the upper surface of the ceramic plate 52.

(Configuration of Adhesion Layer 70)

As shown in FIG. 1, the adhesion layer 70 is provided between the base plate 20 and the electrostatic chuck 80. The adhesion layer 70 bonds the base plate 20 and the electrostatic chuck 80. The adhesion layer 70 is formed to cover, for example, the upper surface of the base plate 20, specifically the entire upper surface of the ceramic plate 53 constituting the upper part 22. The adhesion layer 70 is formed to cover an entire lower surface of the electrostatic chuck 80, for example.

The adhesion layer 70 has, for example, an adhesive layer 71, an adhesion auxiliary layer 72 provided between the adhesive layer 71 and the base plate 20, and an adhesion auxiliary layer 73 provided between the adhesive layer 71 and the electrostatic chuck 80.

As the adhesive layer 71, an adhesive made of, for example, a polymer compound may be used. As the adhesive layer 71, a silicone-based adhesive may be used, for example. The adhesive layer 71 functions, for example, as an adhesive that bonds the base plate 20 and the electrostatic chuck 80, and also functions as a heat conduction member that conducts heat from the electrostatic chuck 80 to the base plate 20. As a material of the adhesive layer 71, a material having high thermal conductivity may be used, for example. Note that a thickness of the adhesive layer 71 may be, for example, about 0.05 mm to 2.0 mm.

The adhesion auxiliary layer 72 is provided to increase the adhesion strength between the base plate 20 and the adhesive layer 71. The adhesion auxiliary layer 72 is in direct contact with the upper surface of the base plate 20 and the lower surface of the adhesive layer 71. As the adhesion auxiliary layer 72, for example, a surface modifier, a coupling agent, or a polymer compound that easily interacts with the adhesive layer 71 may be used. The adhesion auxiliary layer 72 is thinner than the adhesive layer 71, for example. A thickness of the adhesion auxiliary layer 72 may be, for example, about 0.001 mm to 3 mm.

The adhesion auxiliary layer 73 is provided to increase the adhesion strength between the electrostatic chuck 80 and the adhesive layer 71. The adhesion auxiliary layer 73 is in direct contact with the lower surface of the electrostatic chuck 80 and the upper surface of the adhesive layer 71. As the adhesion auxiliary layer 73, for example, a surface modifier, a coupling agent, or a polymer compound that easily interacts with the adhesive layer 71 may be used. The material of the adhesion auxiliary layer 72 and the material of the adhesion auxiliary layer 73 may be, for example, the same type of material or different materials. The adhesion auxiliary layer 73 is thinner than the adhesive layer 71, for example. A thickness of the adhesion auxiliary layer 73 may be, for example, about 0.001 mm to 3 mm.

The adhesion layer 70 has, for example, a gas flow channel 74 penetrating the adhesion layer 70 in the thickness direction. The gas flow channel 74 is formed to penetrate the adhesion auxiliary layer 72, the adhesive layer 71, and the adhesion auxiliary layer 73 in the thickness direction. The gas flow channel 74 opens upward of the adhesion layer 70 and opens downward of the adhesion layer 70. The gas flow channel 74 is formed to communicate with the gas flow channel 40 of the base plate 20.

(Configuration of Electrostatic Chuck 80)

The electrostatic chuck 80 has a substrate main body 81 and an electrode 82 embedded in the substrate main body 81. The electrostatic chuck 80 is, for example, a Johnsen-Rahbeck type electrostatic chuck. Note that the electrostatic chuck 80 may also be a Coulomb-type electrostatic chuck. The electrostatic chuck 80 is a holder that adsorbs and holds a substrate that is a target object to be adsorbed.

The substrate main body 81 is formed, for example, in a disc shape. A diameter of the substrate main body 81 may be, for example, the same as the diameter of the upper part 22 of the base plate 20 or may be larger than the diameter of the upper part 22. The diameter of the substrate main body 81 of the present embodiment is the same as the diameter of the upper part 22. The diameter of the substrate main body 81 may be, for example, about 150 mm to 500 mm. A thickness of the substrate main body 81 may be, for example, about 0.5 mm to 10 mm.

The substrate main body 81 has a mounting surface 81A (here, upper surface) on which a substrate serving as a target object to be adsorbed is mounted. The substrate main body 81 is, for example, a dielectric. The substrate main body 81 is a ceramic substrate formed by, for example, sintering a green sheet fabricated using aluminum oxide.

In the substrate main body 81, for example, a gas flow channel 83 is provided. The gas flow channel 83 is formed to penetrate the substrate main body 81 in the thickness direction. The gas flow channel 83 opens upward of the substrate main body 81 and opens downward of the substrate body 81. The gas flow channel 83 communicates with the gas flow channel 74 of the adhesion layer 70.

In the substrate fixing device 10, a gas hole 11 is formed by the gas flow channel 40, the gas flow channel 74, and the gas flow channel 83. The gas hole 11 is formed to penetrate from the mounting surface 81A of the substrate main body 81 to the lower surface of the base plate 20 by communicating the gas flow channel 40, the gas flow channel 74, and the gas flow channel 83. In the gas hole 11, an inert gas is introduced into the gas hole 11 through the gas flow channel 40, and the inert gas is discharged from the gas hole 11 through the gas flow channel 83. The inert gas discharged from the gas flow channel 83 is filled, for example, between a lower surface of the substrate placed on the mounting surface 81A and the mounting substrate 81A, thereby cooling the substrate.

The electrode 82 is, for example, an electrostatic electrode for adsorbing the substrate placed on the mounting surface 81A. The electrode 82 is an electrode formed in a thin film form. The electrode 82 is embedded, for example, in a portion located near the mounting surface 81A in the thickness direction of the substrate main body 81. The electrode 82 is arranged, for example, on a plane parallel to the mounting surface 81A. The electrode 82 is electrically connected to a power supply for adsorption provided outside the substrate fixing device 10, for example. When a predetermined voltage is applied from the power supply for adsorption, the electrode 82 generates an adsorption force by static electricity between the electrode 82 and the substrate placed on the mounting surface 81A. Thereby, the substrate can be adsorbed and held on the mounting surface 81A. The higher the voltage applied to the electrode 82, the stronger the adsorption holding force of the electrostatic chuck 80. The electrode 82 may have a unipolar shape or a bipolar shape. As a material of the electrode 82, tungsten (W) or molybdenum (Mo) may be used, for example. Note that, although one electrode 82 is shown in each drawing, a plurality of electrodes actually arranged on the same plane are included.

In the present embodiment, the gas flow channel 40 is an example of the first gas flow channel, the hole portion 41 is an example of the first hole portion, the hole portions 42 and 43 are an example of the second hole portion, the hole portion 44 is an example of the third hole portion, and the gas flow channel 83 is an example of the second gas flow channel. The ceramic plate 51 is an example of the first ceramic plate, the ceramic plate 52 is an example of the second ceramic plate, and the ceramic plate 53 is an example of the third ceramic plate. The conductive pattern 61 is an example of the first conductive pattern, the conductive pattern 62 is an example of the second conductive pattern, the conductive pattern 63 is an example of the third conductive pattern, and the conductive pattern 64 is an example of the fourth conductive pattern. The adhesion auxiliary layer 72 is an example of the first adhesion auxiliary layer, the adhesion auxiliary layer 73 is an example of the second adhesion auxiliary layer, and the electrode 82 is an example of the first electrode.

(Manufacturing Method of Substrate Fixing Device 10)

Next, a manufacturing method of the substrate fixing device 10 will be described. Here, a manufacturing method of the base plate 20 will be described in detail. Note that for convenience of description, the parts that ultimately become each component of the base plate 20 will be described by attaching the signs of the final components.

Figure 3:
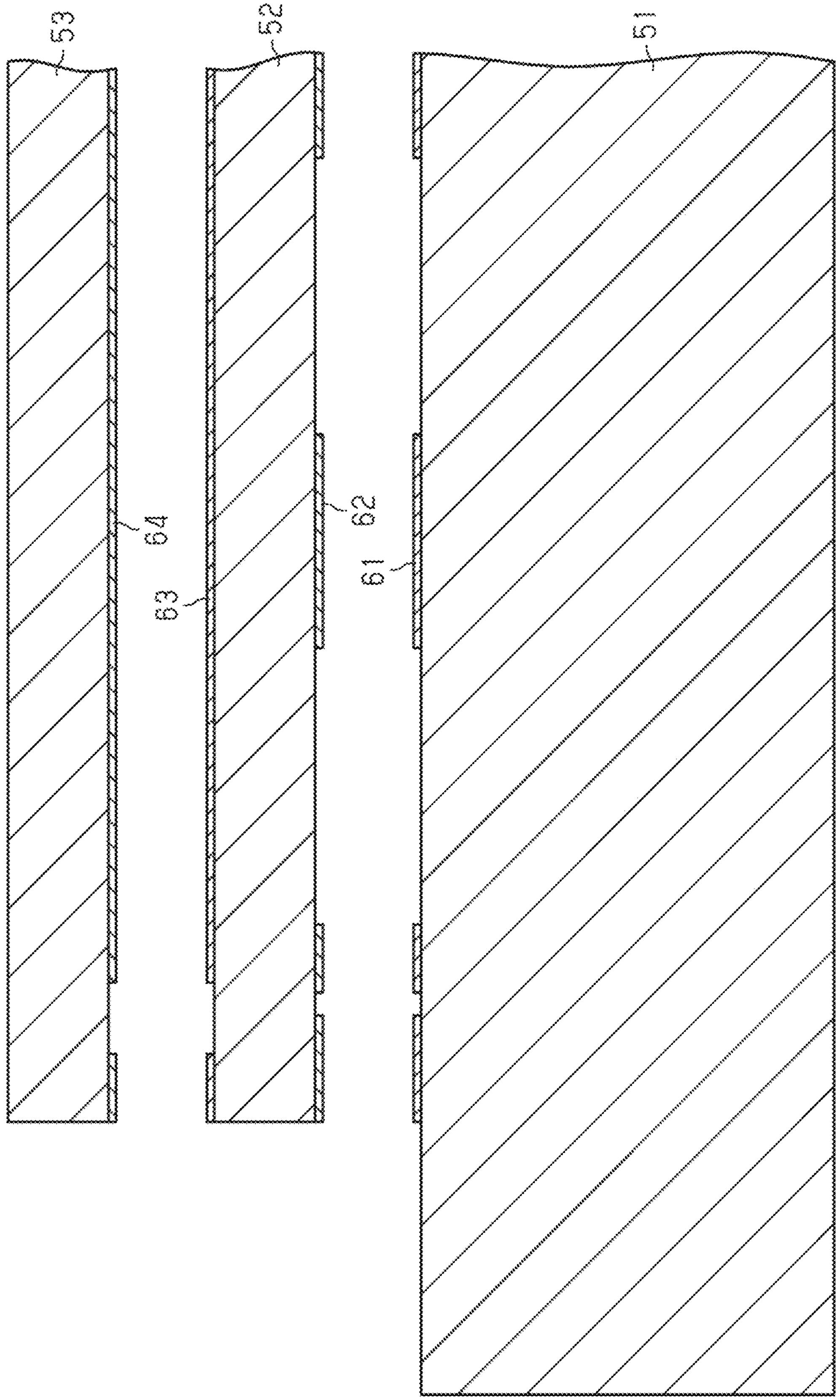
FIG. 3 is a schematic cross-sectional view showing a manufacturing method of a base plate.

First, in a process shown in FIG. 3, a ceramic plate 51 is prepared in which a conductive pattern 61 for soldering is formed on an upper surface. Additionally, a ceramic plate 52 is prepared in which a conductive pattern 62 for soldering is formed on a lower surface and a conductive pattern 63 for soldering is formed on an upper surface. Additionally, a ceramic plate 53 is prepared in which a conductive pattern 64 for soldering is formed on a lower surface. The three ceramic plates 51, 52, and 53 may be manufactured by, for example, a green sheet method.

Subsequently, in a process shown in FIG. 4, the ceramic plate 51 is formed with an introduction portion 31, a discharge portion 32 (see FIG. 1), a recessed portion 33, and a hole portion 41. The introduction portion 31, discharge portion 32, recessed portion 33, and hole portion 41 may be formed by, for example, a laser processing method or a mechanical processing method.

Figure 4:
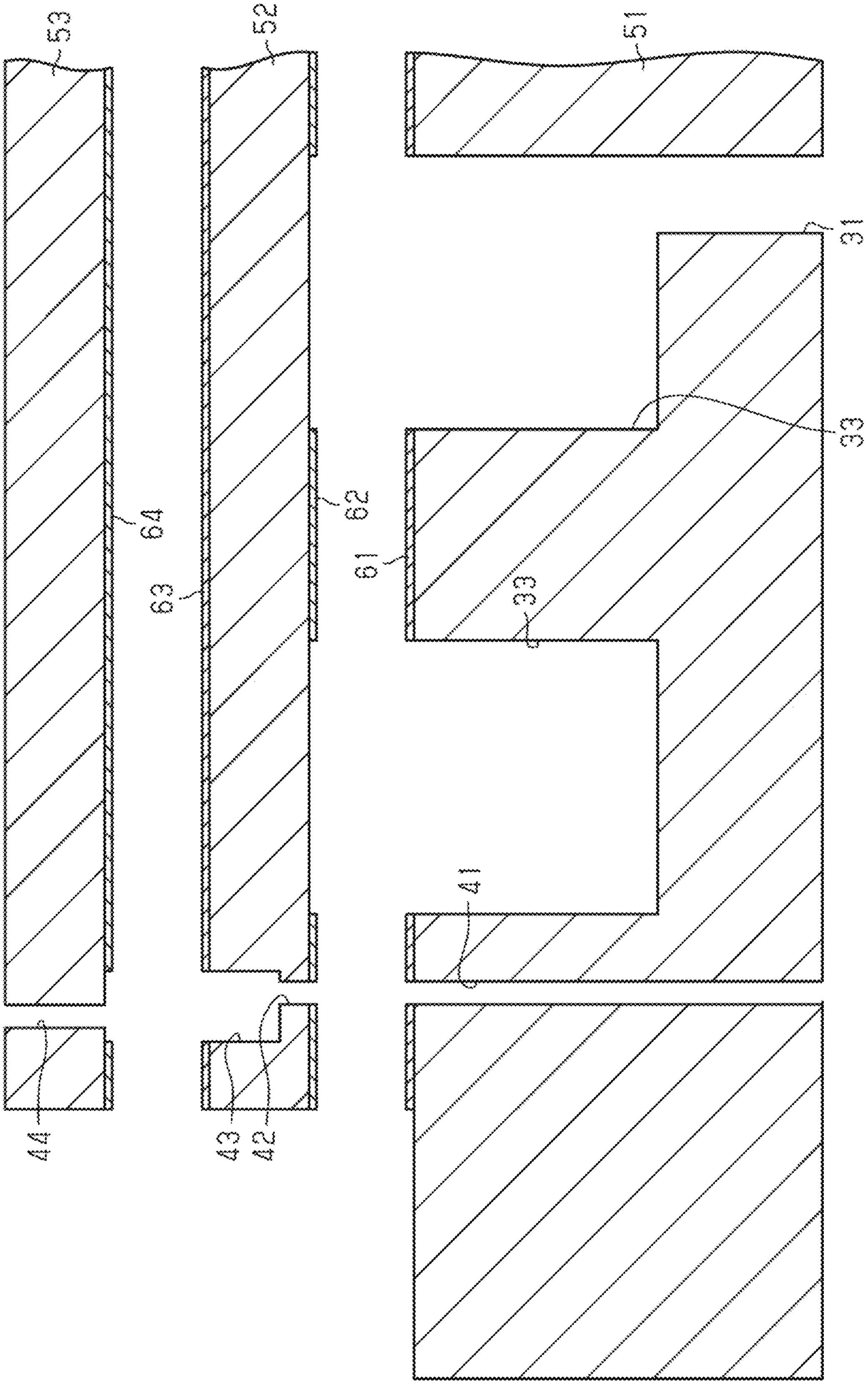
FIG. 4 is a schematic cross-sectional view showing the manufacturing method of the base plate.

Additionally, in the process shown in FIG. 4, the ceramic plate 52 is formed with a hole portion 42 and a hole portion 43. The hole portion 42 and the hole portion 43 may be formed by, for example, a laser processing method or a mechanical processing method.

Additionally, in the process shown in FIG. 4, the ceramic plate 53 is formed with a hole portion 44. The hole portion 44 may be formed by, for example, a laser processing method or a mechanical processing method.

Next, the ceramic plate 52 is arranged above the ceramic plate 51 with the conductive pattern 62 facing the conductive pattern 61. At this time, the ceramic plates 51 and 52 are positionally aligned so that the hole portion 42 overlaps the hole portion 41 in a plan view. Additionally, the ceramic plate 53 is arranged above the ceramic plate 52 with the conductive pattern 64 facing the conductive pattern 63. At this time, the ceramic plates 52 and 53 are positionally aligned so that the hole portion 44 overlaps the hole portion 43 in a plan view.

Figure 5:
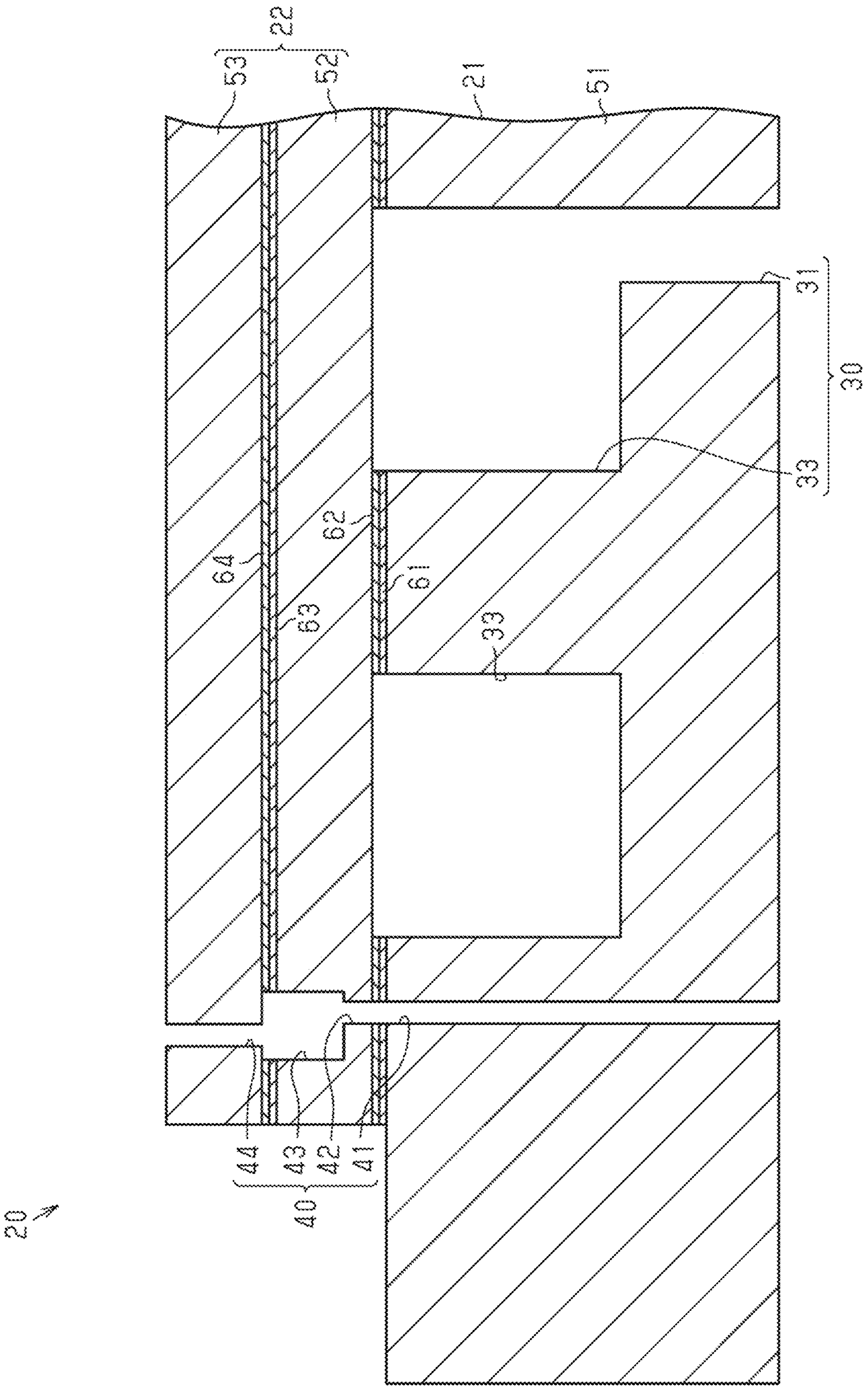
FIG. 5 is a schematic cross-sectional view showing the manufacturing method of the base plate.

Next, in a process shown in FIG. 5, the conductive pattern 61 and the conductive pattern 62 are joined by soldering. As a result, the ceramic plate 52 can be joined to the upper surface of the ceramic plate 51. Additionally, the conductive pattern 63 and the conductive pattern 64 are joined by soldering. As a result, the ceramic plate 53 can be joined to the upper surface of the ceramic plate 52. Through this process, the opening of the recessed portion 33 is closed by the ceramic plate 52. As a result, a cooling path channel 30 is formed by the introduction portion 31, discharge portion 32 (see FIG. 1) and recessed portion 33 formed in the ceramic plate 51 and the ceramic plate 52 closing the opening of the recessed portion 33. Additionally, through this process, the hole portion 41 of the ceramic plate 51, the hole portions 42 and 43 of the ceramic plate 52, and the hole portion 44 of the ceramic plate 53 are communicated to form a gas flow channel 40.

Through the above manufacturing process, the base plate 20 shown in FIGS. 1 and 2 can be manufactured.

Subsequently, operational effects of the present embodiment are described.

(1) The substrate fixing device 10 includes the ceramic base plate 20, the ceramic electrostatic chuck 80 having the mounting surface 81A on which a target object to be adsorbed is mounted, and the adhesion layer 70 bonding the base plate 20 and the electrostatic chuck 80.

According to this configuration, both the base plate 20 and the electrostatic chuck 80 are made of ceramic materials. For this reason, compared to a case where the base plate 20 is made of a metal material such as an aluminum alloy, a difference in thermal expansion coefficient between the base plate 20 and the electrostatic chuck 80 can be reduced. Therefore, even when the substrate fixing device 10 is exposed to a low temperature of about −60° C. or a high temperature of about 180° C., a large difference between an amount of thermal deformation of the base plate 20 and an amount of thermal deformation of the electrostatic chuck 80 can be suppressed. As a result, since it is possible to favorably suppress a large stress from acting on the adhesion layer 70 bonding the base plate 20 and the electrostatic chuck 80, it is possible to favorably suppress cohesive failure from occurring in the adhesion layer 70. Thereby, a decrease in the in-plane uniformity of the thermal resistance of the adhesion layer 70 can be suppressed, and therefore, unevenness in the temperature of the mounting surface 81A of the electrostatic chuck 80 can be suppressed. Therefore, compared to the case where the base plate 20 is made of a metal material such as an aluminum alloy, the uniformity in temperature of the mounting surface 81A of the electrostatic chuck 80 can be improved.

(2) When the substrate fixing device 10 operates, the temperature of the base plate 20 and the temperature of the electrostatic chuck 80 may be different from each other. Here, in the substrate fixing device 10 of the present embodiment, the adhesion layer 70 is provided between the base plate 20 and the electrostatic chuck 80. For this reason, even if the temperatures of the base plate 20 and the electrostatic chuck 80 are different, the stress generated due to the difference in temperature can be favorably absorbed by the adhesion layer 70. Thereby, it is possible to favorably prevent the base plate 20 and the electrostatic chuck 80 from being broken by the stress generated due to the difference in temperature between the base plate 20 and the electrostatic chuck 80.

In order to confirm the above-described effects, the present inventors analyzed the stress generated inside the substrate fixing device 10 when the substrate fixing device 10 operates, through simulation.

Specifically, for an example model in which the adhesion layer 70 was provided between the base plate 20 and the electrostatic chuck 80 and a comparative example model in which the adhesion layer 70 was not provided, a simulation was performed with respect to the stress generated inside the substrate fixing device 10. The simulation method is finite element analysis by Abaqus. The other simulation conditions were the stress-free temperature of 60° C., the surface temperature of 300° C., the cooling temperature of 50° C., and the thermal expansion coefficients of the base plate 20 and the electrostatic chuck 80 of 7.3 ppm/° C.

Through this simulation, it was confirmed that the stress generated inside the substrate fixing device 10 was smaller in the example model in which the adhesion layer 70 was provided, compared to the comparative example model in which the adhesion layer 70 was not provided. Specifically, the maximum main stress in the example model was 0.26 to 0.28 times the maximum main stress in the comparative example model. From the simulation result, it can be seen that by providing the adhesion layer 70, the stress generated inside the substrate fixing device 10 can be reduced.

(3) The base plate 20 and the electrostatic chuck 80 are made of ceramic materials containing the same material as a main component. Thereby, the difference in thermal expansion coefficient between the base plate 20 and the electrostatic chuck 80 can be further reduced. Therefore, even when the substrate fixing device 10 is exposed to a low temperature of about −60° C. or a high temperature of about 180° C., high stress can be more favorably suppressed from acting on the adhesion layer 70, so that unevenness in the temperature of the mounting surface 81A of the electrostatic chuck 80 can be more favorably suppressed.

(4) The ceramic base plate 20 is constructed by the plurality of ceramic plates 51, 52, and 53 joined to each other by soldering. In this configuration, the conductive patterns 61, 62, 63, and 64 for soldering are provided on the ceramic plates 51, 52, and 53. Then, the conductive patterns 61 and 62 are joined by soldering to join the ceramic plates 51 and 52, and the conductive patterns 63 and 64 are joined by soldering to join the ceramic plates 52 and 53. The base plate 20 formed in this way has a structure having the conductive patterns 61, 62, 63, and 64. For this reason, the stiffness of the base plate 20 can be increased compared to, for example, a case where the ceramic plates 51, 52, and 53 are joined to each other by an adhesive.

Other Embodiments

The above embodiment can be changed and implemented, as follows. The above embodiment and the following variations can be implemented in combination with each other within a technically consistent range.

The structure of the substrate fixing device 10 in the above embodiment can be appropriately changed.

Figure 6:
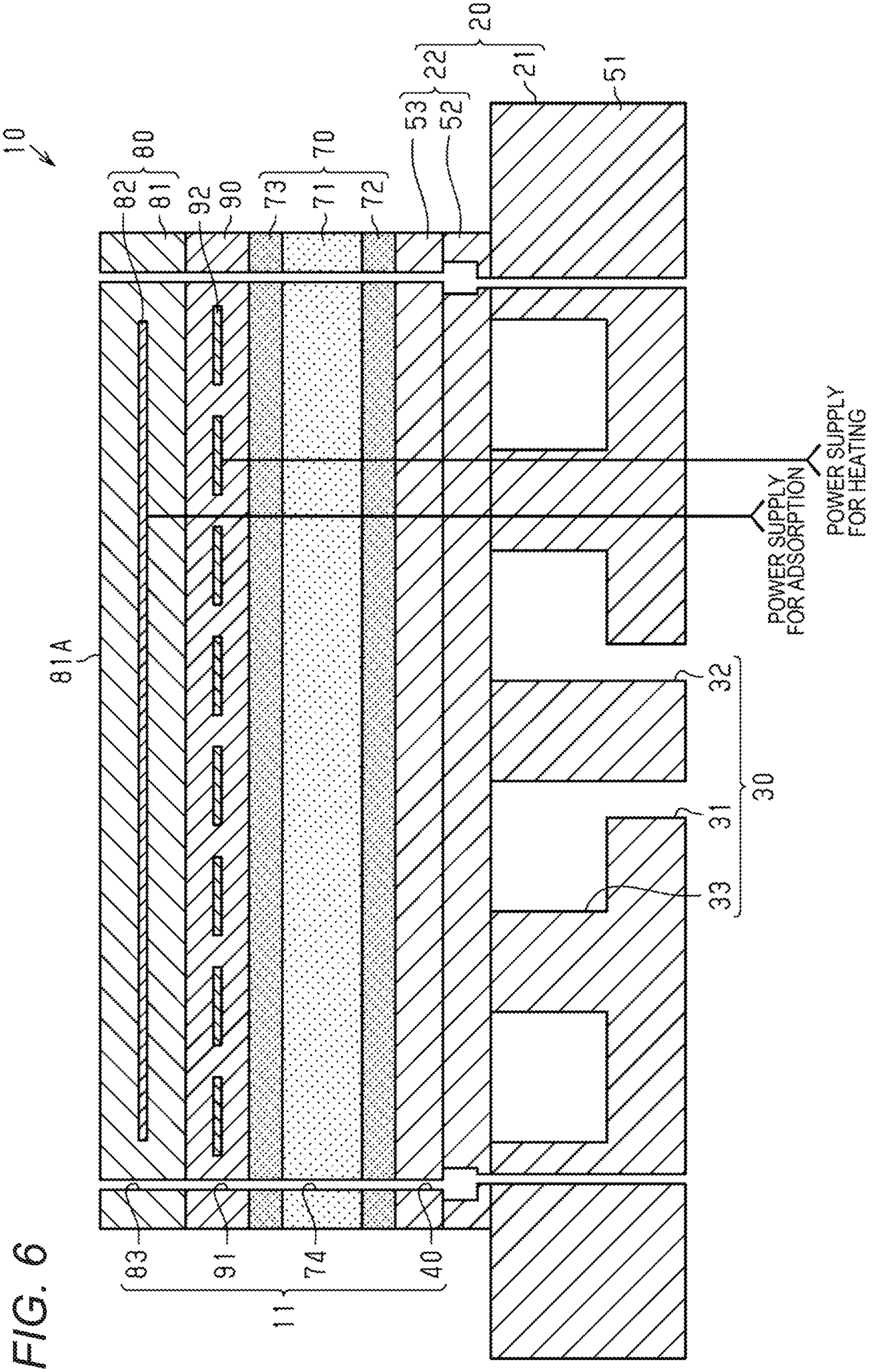
FIG. 6 is a schematic cross-sectional view showing a substrate fixing device according to a variation.

For example, as shown in FIG. 6, a resin layer 90 may be provided between the adhesion layer 70 and the electrostatic chuck 80. Additionally, an electrode 92 embedded in the resin layer 90 may be provided.

The resin layer 90 is stacked on the upper surface of the adhesion layer 70. The resin layer 90 of the present variation is stacked on the upper surface of the adhesion auxiliary layer 73. The resin layer 90 is an insulating layer for insulating the electrode 92 and the electrode 82, for example. As a material of the resin layer 90, for example, an epoxy resin, a bismaleimide triazine resin, or the like may be used. The resin layer 90 may also contain a filler such as alumina or aluminum nitride. A thickness of the resin layer 90 may be about 100 μm to 150 μm, for example.

In the resin layer 90, for example, a gas flow channel 91 is provided. The gas flow channel 91 is formed to penetrate the resin layer 90 in the thickness direction. The gas flow channel 91 opens upward of the resin layer 90 and opens downward of the resin layer 90. The gas flow channel 91 communicates with the gas flow channel 74 of the adhesion layer 70 and the gas flow channel 83 of the electrostatic chuck 80.

The electrode 92 is, for example, a heat generating element for heating the substrate placed on the mounting surface 81A. The electrode 92 is arranged, for example, on a plane parallel to the mounting surface 81A. The electrode 92 is electrically insulated from the electrode 82. As a material of the electrode 92, copper (Cu), tungsten, nickel (Ni), or the like may be used, for example. A thickness of the electrode 92 may be about 20 μm to 100 μm, for example. The electrode 92 may be patterned in a concentric circle shape, for example.

The electrode 92 is electrically connected to a power supply for heating provided outside the substrate fixing device 10, for example. The electrode 92 generates heat in response to a voltage applied from the power supply for heating. The electrode 92 heats the mounting surface 81A of the electrostatic chuck 80 so that the mounting surface reaches a predetermined temperature. The electrode 92 can heat the mounting surface 81A so that the temperature thereof reaches about 250° C. to 300° C., for example. Note that the electrode 92 is an example of the second electrode.

An emboss may be provided on the mounting surface 81A of the electrostatic chuck 80 of the above embodiment.

The adhesion auxiliary layer 72 in the substrate fixing device 10 of the above embodiment may be omitted.

The adhesion auxiliary layer 73 in the substrate fixing device 10 of the above embodiment may be omitted.

The shape of the gas hole 11 in the substrate fixing device 10 of the above embodiment may be changed appropriately. In addition, the gas hole 11 may be omitted.

The shape of the cooling channel 30 in the base plate 20 of the above embodiment may be changed appropriately. In addition, the cooling channel 30 may be omitted.

In the base plate 20 of the above embodiment, the ceramic plates 51, 52, and 53 are joined to each other by soldering, but the present invention is not limited thereto. For example, the conductive patterns 61 and 62 may be joined to each other by a conductive adhesive, and the conductive patterns 63 and 64 may be joined to each other by a conductive adhesive. Additionally, the conductive patterns 61, 62, 63, and 64 may be omitted, and the ceramic plates 51, 52, and 53 may be joined to each other by an adhesive such as a silicone adhesive.

The number of ceramic plates 51, 52, and 53 in the base plate 20 of the above embodiment is not particularly limited. For example, the base plate 20 may have one or two ceramic plates, or four or more ceramic plates.

In the manufacturing method of the above embodiment, the ceramic plates 51, 52, and 53 after firing the green sheets are formed with the recessed portion 33 and the hole portions 41, 42, 43, and 44, but the present invention is not limited thereto. For example, the recessed portion 33 and the hole portions 41, 42, 43, and 44 may be formed at a stage before firing the green sheets, that is, in the green sheets before the firing.

In the above embodiment, the substrate fixing device 10 is applied to a semiconductor manufacturing apparatus, for example, a dry etching apparatus. Examples of the dry etching apparatus include a parallel flat plate type reactive ion etching apparatus. Further, the substrate fixing device 10 can also be applied to a semiconductor manufacturing apparatus such as a plasma CVD (Chemical Vapor Deposition) apparatus and a sputtering apparatus.

What is claimed is:

1. A substrate fixing device comprising:
a ceramic base plate;
a ceramic electrostatic chuck having a mounting surface on which a target object to be adsorbed is mounted; and
an adhesion layer bonding the base plate and the electrostatic chuck,
wherein
the base plate has a plurality of ceramic plates which are stacked,
the plurality of ceramic plates comprise:
a first ceramic plate with a first conductive pattern formed on an upper surface, and
a second ceramic plate with a second conductive pattern formed on a lower surface and joined to the first conductive pattern,
the second ceramic plate is joined to the upper surface of the first ceramic plate through joining of the first conductive pattern and the second conductive pattern,
the base plate has a cooling channel formed by a recessed portion recessed downward from the upper surface of the first ceramic plate and the second ceramic plate provided to close an opening of the recessed portion, and
wherein the second conductive pattern is provided to overlap the first conductive pattern and not to overlap the recessed portion in a plan view.

2. A substrate fixing device comprising:
a ceramic base plate;
a ceramic electrostatic chuck having a mounting surface on which a target object to be adsorbed is mounted; and
an adhesion layer bonding the base plate and the electrostatic chuck,
wherein
the base plate has a plurality of ceramic plates which are stacked,
the plurality of ceramic plates comprise:
a first ceramic plate with a first conductive pattern formed on an upper surface, and
a second ceramic plate with a second conductive pattern formed on a lower surface and joined to the first conductive pattern,
the second ceramic plate is joined to the upper surface of the first ceramic plate through joining of the first conductive pattern and the second conductive pattern,
a third conductive pattern is formed on an upper surface of the second ceramic plate,
the plurality of ceramic plates further comprise a third ceramic plate with a fourth conductive pattern formed on a lower surface and joined to the third conductive pattern,
the third ceramic plate is joined to the upper surface of the second ceramic plate through joining of the third conductive pattern and the fourth conductive pattern,
the base plate has a first gas flow channel penetrating the base plate in a thickness direction,
the electrostatic chuck has a second gas flow channel communicating with the first gas flow channel, and
the first gas flow channel comprises a first hole portion penetrating the first ceramic plate in the thickness direction, a second hole portion penetrating the second ceramic plate in the thickness direction and communicating with the first hole portion, and a third hole portion penetrating the third ceramic plate in the thickness direction and communicating with the second hole portion.

3. The substrate fixing device according to claim 1, wherein the first conductive pattern and the second conductive pattern are joined to each other by soldering.

4. The substrate fixing device according to claim 1, wherein the adhesion layer comprises:
an adhesive layer provided between the base plate and the electrostatic chuck,
a first adhesion auxiliary layer provided between the adhesive layer and the base plate, and
a second adhesion auxiliary layer provided between the adhesive layer and the electrostatic chuck.

5. The substrate fixing device according to claim 1, further comprising:
a first electrode embedded in the electrostatic chuck.

6. The substrate fixing device according to claim 1, further comprising:
a resin layer provided between the electrostatic chuck and the adhesion layer, and
a second electrode embedded in the resin layer.

7. The substrate fixing device according to claim 1, wherein the base plate and the electrostatic chuck are made of ceramic materials containing the same material as a main component.

8. The substrate fixing device according to claim 2, wherein the first conductive pattern and the second conductive pattern are joined to each other by soldering.

9. The substrate fixing device according to claim 2, wherein the adhesion layer comprises:
an adhesive layer provided between the base plate and the electrostatic chuck,
a first adhesion auxiliary layer provided between the adhesive layer and the base plate, and
a second adhesion auxiliary layer provided between the adhesive layer and the electrostatic chuck.

10. The substrate fixing device according to claim 2, further comprising:
a first electrode embedded in the electrostatic chuck.

11. The substrate fixing device according to claim 2, further comprising:

a resin layer provided between the electrostatic chuck and the adhesion layer, and a second electrode embedded in the resin layer.

12. The substrate fixing device according to claim 2, wherein the base plate and the electrostatic chuck are made of ceramic materials containing the same material as a main component.

* * * * *